(12) United States Patent
Yoshida

(10) Patent No.: US 11,015,240 B2
(45) Date of Patent: May 25, 2021

(54) HARD DECORATIVE MEMBER AND METHOD FOR MANUFACTURING THE SAME

(71) Applicant: CITIZEN WATCH CO., LTD., Tokyo (JP)

(72) Inventor: Rikuto Yoshida, Tokyo (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 16/435,685

(22) Filed: Jun. 10, 2019

(65) Prior Publication Data

US 2019/0376175 A1   Dec. 12, 2019

(30) Foreign Application Priority Data

Jun. 11, 2018   (JP) ................. JP2018-111104

(51) Int. Cl.
| | |
|---|---|
| A44C 27/00 | (2006.01) |
| C23C 14/06 | (2006.01) |
| C23C 14/14 | (2006.01) |
| C23C 14/16 | (2006.01) |
| C23C 14/18 | (2006.01) |
| C22C 5/02 | (2006.01) |
| C22C 14/00 | (2006.01) |
| C23C 14/02 | (2006.01) |
| C23C 14/30 | (2006.01) |

(52) U.S. Cl.
CPC .............. *C23C 14/18* (2013.01); *C22C 5/02* (2013.01); *C22C 14/00* (2013.01); *C23C 14/024* (2013.01); *C23C 14/0641* (2013.01); *C23C 14/30* (2013.01)

(58) Field of Classification Search
CPC ........... C22C 5/02; C23C 14/18; C23C 14/00; C23C 14/024; C23C 14/30; C23C 14/0641; C23C 14/16; C23C 14/0015; C23C 14/0664; C23C 14/32; C23C 14/0021
See application file for complete search history.

(56) References Cited

U.S. PATENT DOCUMENTS

2010/0255338 A1* 10/2010 Hayakawa .......... C23C 14/0664
                                                          428/627

FOREIGN PATENT DOCUMENTS

| EP | 2 135 972 A1 | 12/2009 | |
|---|---|---|---|
| JP | 10245646 A * | 9/1998 | |
| JP | WO2008108181 A1 * | 6/2010 | ........... C23C 28/341 |
| WO | 2008/108181 A1 | 9/2008 | |

* cited by examiner

*Primary Examiner* — Daniel J. Schleis
*Assistant Examiner* — Kevin CT Li
(74) *Attorney, Agent, or Firm* — Sughrue Mion, PLLC

(57) ABSTRACT

A hard decorative member of the invention includes a gold alloy layer that is formed as a film by a dry plating method on a base material made of titanium or composed of a base and titanium formed on a surface of the base. The hard decorative member includes an undercoat layer that is formed on the base material and includes titanium carbon nitride, an adhesion layer that is formed on the undercoat layer and includes titanium carbon nitride, gold, copper and palladium, and a gold alloy layer that is formed on the adhesion layer and includes gold, copper and palladium. The gold alloy layer contains 70.3 to 75.2% by weight of gold, 20.7 to 25.6% by weight of copper, and 3.7 to 4.3% by weight of palladium.

11 Claims, 3 Drawing Sheets

FIG.5

| | BASE MATERIAL Wt% | UNDERLAYER | | | | | | | | | GOLD ALLOY LAYER | | | | | | | | | APPEARANCE WHEN GOLD ALLOY LAYER IS PARTIALLY LOST | ACCEPTANCE DETERMINATION |
|---|---|---|---|---|---|---|---|---|---|---|---|---|---|---|---|---|---|---|---|---|---|
| | | COMPOSITION Wt% | | | CIElab | | | VICKERS HARDNESS Hv | | | COMPOSITION Wt% | | | CIElab | | | VICKERS HARDNESS Hv | | | | |
| | Ti | Ti | C | N | $L^*$ | $a^*$ | $b^*$ | | | | Au | Cu | Pd | $L^*$ | $a^*$ | $b^*$ | | | | | |
| EXAMPLE 1 | 100 | 67.3 | 5.1 | 27.6 | 71.8 | 6.5 | 14.2 | 2112 | | | 73.1 | 22.8 | 4.1 | 85.4 | 6.0 | 10.5 | 740 | | | LOST PORTION CANNOT BE VISUALLY RECOGNIZED | ACCEPTED |
| EXAMPLE 2 | 100 | 69.0 | 5.2 | 25.9 | 72.0 | 6.2 | 13.4 | 2182 | | | 75.2 | 20.7 | 4.1 | 84.7 | 6.0 | 10.3 | 760 | | | LOST PORTION CANNOT BE VISUALLY RECOGNIZED | ACCEPTED |
| EXAMPLE 3 | 100 | 68.7 | 5.3 | 26.0 | 70.9 | 7.1 | 13.2 | 2259 | | | 71.4 | 25.0 | 3.7 | 85.3 | 6.0 | 10.6 | 791 | | | LOST PORTION CANNOT BE VISUALLY RECOGNIZED | ACCEPTED |
| EXAMPLE 4 | 100 | 67.6 | 5.3 | 27.0 | 70.6 | 6.7 | 11.7 | 2360 | | | 72.2 | 23.6 | 4.3 | 85.4 | 6.0 | 10.4 | 754 | | | LOST PORTION CANNOT BE VISUALLY RECOGNIZED | ACCEPTED |
| EXAMPLE 5 | 100 | 68.2 | 4.9 | 26.9 | 73.0 | 5.5 | 15.2 | 2385 | | | 72.4 | 23.4 | 4.2 | 84.6 | 5.9 | 10.6 | 734 | | | LOST PORTION CANNOT BE VISUALLY RECOGNIZED | ACCEPTED |
| EXAMPLE 6 | 100 | 68.6 | 5.2 | 26.3 | 73.0 | 5.0 | 13.8 | 2234 | | | 70.3 | 25.6 | 4.1 | 85.4 | 6.1 | 10.6 | 723 | | | LOST PORTION CANNOT BE VISUALLY RECOGNIZED | ACCEPTED |
| COMPARATIVE EXAMPLE 1 | 100 | 65.2 | 4.8 | 30.0 | 69.0 | 10.1 | 14.1 | 2230 | | | 74.0 | 21.6 | 4.4 | 84.9 | 6.0 | 10.7 | 884 | | | LOST PORTION IS VISUALLY OBSERVED AS RED | FAILED |
| COMPARATIVE EXAMPLE 2 | 100 | 68.5 | 6.0 | 25.5 | 72.6 | 4.4 | 10.5 | 2087 | | | 75.8 | 20.0 | 4.2 | 84.6 | 6.0 | 10.7 | 872 | | | LOST PORTION IS VISUALLY OBSERVED AS YELLOW | FAILED |

HARD DECORATIVE MEMBER AND METHOD FOR MANUFACTURING THE SAME

CROSS-REFERENCE TO RELATED APPLICATION(S)

The present application claims priority to and incorporates by reference the entire contents of Japanese Patent Application No. 2018-111104 filed in Japan on Jun. 11, 2018.

BACKGROUND OF THE INVENTION

1. Field of the Invention

The present invention relates to a hard decorative member having a gold alloy layer formed as a film by a dry plating method on a base material and a method for manufacturing the hard decorative member.

2. Description of the Related Art

Watch exterior parts such as watch casings and watch bracelets and decorative articles such as spectacle frames, finger rings, and necklaces have been requested to have various gold color tones and high metallic decorative property. Some attempts have been made to respond to the demands described above by forming various decorative films on base materials such as titanium and stainless steel to manufacture decorative members. Among the demands for gold color tones, the demand for a pink gold color is high. Gold alloy layers are used that are formed by a dry plating method from the point of view of abrasion resistance and costs.

For example, WO2008/108181 discloses a gold alloy coating clad laminate and a gold alloy coating clad member in which a base plating layer is formed on a base material and a gold alloy coating is formed on the base plating layer by a dry plating method, and describes that the gold alloy coating clad laminate and the gold alloy coating clad member have a pink color appearance (FIG. 1 in page 2).

Decorative members, however, have been demanded that have a light, pale pink color, particularly, a pink color like cherry blossoms, among pink colors. Such a pink color cannot be achieved by the decorative member described in WO2008/108181. When the gold alloy coating is locally lost by scratches, for example, its aesthetic appearance cannot be maintained due to a color difference between the gold alloy coating and the base plating layer.

SUMMARY OF THE INVENTION

The invention aims to provide a hard decorative member that has a pale pink gold color appearance and can maintain its aesthetic appearance even in long-time use.

A hard decorative member according to one aspect of the present invention includes a gold alloy layer formed as a film by a dry plating method on a base material made of titanium or composed of a base and titanium formed on a surface of the base, and includes an undercoat layer that is formed on the base material and includes titanium carbon nitride, an adhesion layer that is formed on the undercoat layer and includes titanium carbon nitride, gold, copper and palladium, and a gold alloy layer that is formed on the adhesion layer and includes gold, copper and palladium, wherein the gold alloy layer contains 70.3 to 75.2% by weight of gold, 20.7 to 25.6% by weight of copper and 3.7 to 4.3% by weight of palladium.

According to another aspect of the present invention, in the hard decorative member, it is preferable that the gold alloy layer has a Vickers hardness of from 700 to 800 in a layer structure composed of the undercoat layer, the adhesion layer and the gold alloy layer.

According to still another aspect of the present invention, in the hard decorative member, it is preferable that a color evaluation according to an $L^*a^*b^*$ color specification system of the gold alloy layer satisfies that $84.6 \leq L^* \leq 85.4$, $5.9 \leq a^* \leq 6.1$ and $10.3 \leq b^* \leq 10.6$.

According to still another aspect of the present invention, in the hard decorative member, it is preferable that the undercoat layer has a Vickers hardness of from 2100 to 2400.

According to still another aspect of the present invention, in the hard decorative member, it is preferable that the undercoat layer contains 65.3 to 69.5% by weight of titanium, 4.9 to 5.9% by weight of carbon and 25.6 to 29.9% by weight of nitrogen.

According to still another aspect of the present invention, in the hard decorative member, it is preferable that a color evaluation according to an $L^*a^*b^*$ color specification system of the undercoat layer satisfies that $70.6 \leq L^* \leq 73.0$, $5.0 \leq a^* \leq 7.1$ and $11.7 \leq b^* \leq 15.2$.

A method for manufacturing a hard decorative member according to still another aspect of the present invention include an undercoat layer-forming step of forming an undercoat layer including titanium carbon nitride on a base material made of titanium or composed of a base and titanium formed on a surface of the base, an adhesion layer-forming step of forming an adhesion layer on the undercoat layer, the adhesion layer including titanium carbon nitride, gold, copper and palladium, and a gold alloy layer-forming step of forming a gold alloy layer on the adhesion layer, the gold alloy layer containing 70.3 to 75.2% by weight of gold, 20.7 to 25.6% by weight of copper and 3.7 to 4.3% by weight of palladium.

According to still another aspect of the present invention, in the method for manufacturing a hard decorative member, it is preferable that, at the undercoat layer-forming step, the undercoat layer containing 65.3 to 69.5% by weight of titanium, 4.9 to 5.9% by weight of carbon and 25.6 to 29.9% by weight of nitrogen is formed.

According to still another aspect of the present invention, in the method for manufacturing a hard decorative member, it is preferable that, at the undercoat layer-forming step, titanium is vaporized while argon gas, nitrogen gas and methane gas are introduced into a chamber of a vacuum device, and a cathode voltage is applied to the base material.

According to still another aspect of the present invention, in the method for manufacturing a hard decorative member, it is preferable that, at the adhesion layer-forming step, titanium and a gold alloy including gold, copper and palladium are vaporized while argon gas, nitrogen gas and methane gas are introduced into a chamber of a vacuum device, and a cathode voltage is applied to the base material.

According to still another aspect of the present invention, in the method for manufacturing a hard decorative member, it is preferable that, at the gold alloy layer-forming step, a gold alloy including gold, copper and palladium is vaporized while argon gas is introduced into a chamber of a vacuum device, and a cathode voltage is applied to the base material.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a table illustrating characteristics of the hard decorative member according to the embodiment of the invention.

DETAILED DESCRIPTION OF THE PREFERRED EMBODIMENTS

The following describes embodiments of the invention in detail with reference to the accompanying drawings. The embodiments described below exemplarily describe a hard decorative member that embodies the spirit of the invention. The invention is not limited to the structure described below. The scope of the invention does not limit the dimensions, materials, shapes, and relative arrangements of components described in the embodiments to those described herein unless otherwise specifically described. They are merely exemplified. In the following description, the same names and numerals are used for the same parts and the same constituent elements, and the detailed descriptions thereof may be omitted as appropriate.

Figure 1:
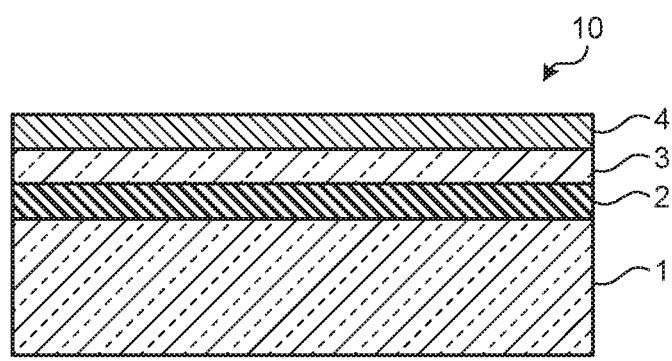
FIG. 1 is a cross-sectional view illustrating a hard decorative member according to an embodiment of the invention.

The following describes a structure of a hard decorative member according to an embodiment of the invention with reference to FIGS. 1 to 5. FIG. 1 is a cross-sectional view illustrating the structure of the hard decorative member of the invention. FIG. 5 is a table illustrating evaluation results of examples 1 to 6 to which the invention is applied and comparative examples 1 and 2.

As illustrated in FIG. 1, a hard decorative member 10 according to the invention is a hard decorative member that has a gold alloy layer formed as a film by a dry plating method on a base material made of titanium or composed of a base and titanium formed on a surface of the base. The hard decorative member 10 includes an undercoat layer 2 that is formed on a base material 1 and includes titanium carbon nitride, an adhesion layer 3 that is formed on the undercoat layer 2 and includes titanium nitride, gold, copper and palladium, and a gold alloy layer 4 that is formed on the adhesion layer 3 and includes gold, copper and palladium.

A color evaluation of the undercoat layer 2 according to an L*a*b* color specification system satisfies that 70.6≤L*≤73.0, 5.0≤a*≤7.1, and 11.7≤b*≤15.2, so that the undercoat layer 2 has a pale pink color appearance. A color evaluation of the gold alloy layer 4 according to the L*a*b* color specification system satisfies that 84.6≤L*≤85.4, 5.9≤a*≤6.1, and 10.3≤b*≤10.6, and, so that the gold alloy layer 4 has a pale pink color appearance.

The color tones of the undercoat layer 2 and the gold alloy layer 4 are evaluated on the basis of L*a*b* in an L*a*b* chromaticity diagram measured using CM-2600d manufactured by Konica Minolta Inc., Spectra Magic NX, as measurement software, and a CIE standard light source D65 as a light source.

Base Material

The base material 1 is formed of metal or ceramics. Practical examples of the metal include stainless steel, titanium, titanium alloys, copper, copper alloys, tungsten, hardened stainless steel, titanium, and titanium alloys. These metals can be used singly or in combination of two or more of them. The shape of the base material 1 is not limited to any specific shape.

Figure 2:
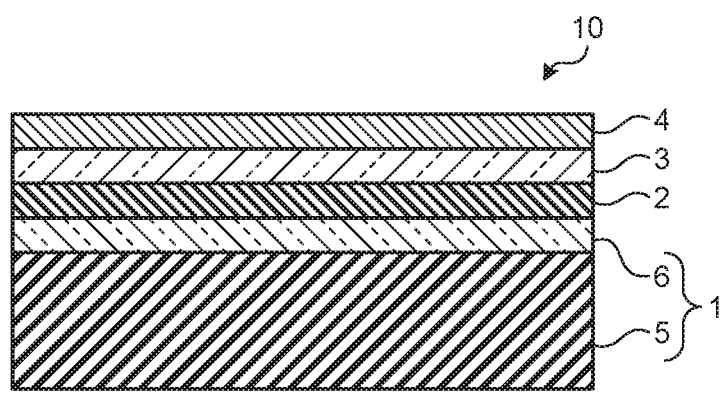
FIG. 2 is another cross-sectional view illustrating the hard decorative member according to the embodiment of the invention.

When a material other than titanium is used for the base material 1, the base material 1 can be used that is composed of a base 5 and a base material adhesion layer 6 formed on a surface of the base 5 as illustrated in FIG. 2. Various materials can be used for the base 5. As the base material adhesion layer 6, titanium is formed on the surface of the base 5. For example, inexpensive stainless steel is used as the base 5, and titanium is formed on the surface of the base 5 as the base material adhesion layer 6.

As the base material adhesion layer 6, titanium is formed on the surface of the base 5 with a thickness of approximately 0.05 μm by an ion plating method.

Undercoat Layer

The undercoat layer 2 is a layer including titanium carbon nitride. In the case that the undercoat layer 2 contains 65.3 to 69.5% by weight of titanium, 4.9 to 5.9% by weight of carbon, and 25.6 to 29.9% by weight of nitrogen as it is composition, the undercoat layer 2 having a light, pale pink color close to the color of the gold alloy layer 4 can be formed. In the case that the undercoat layer 2 contains 67.3 to 69.0% by weight of titanium, 4.9 to 5.3% by weight of carbon, and 25.9 to 27.6% by weight of nitrogen as it is composition, the undercoat layer 2 having a light, pale pink color closer to the color of the gold alloy layer 4 can be formed, as shown in the examples 1 to 6. Even when the adhesion layer 3 on the undercoat layer 2 or the gold alloy layer 4 above the undercoat layer 2 is peeled off, the undercoat layer 2 has a pale pink color close to the color of the gold alloy layer 4. The hard decorative member according to the invention, thus, makes little difference in appearance between the peeled off portion and the other portion.

The undercoat layer 2 having the composition described above has a Vickers hardness ranging between 2100 and 2400 inclusive, and excellent durability such as scratch resistance and abrasion resistance while having a pale pink color appearance. The undercoat layer 2 sufficiently harder than the base material 1 improves scratch resistance, thereby causing the adhesion layer 3 and the gold alloy layer 4 to be hardly peeled off.

The Vickers hardness of the undercoat layer 2 is measured using HM2000XYp manufactured by Fischer Instruments Co., Ltd., which is a micro indentation hardness tester. A Vickers indenter, which is used as a gauge head, is held under a load of 5 mN for 10 seconds. After unloading, the hardness is calculated from the penetration depth of the Vickers indenter.

The undercoat layer 2 is preferably formed with a thickness of approximately 0.3 μm. When the film thickness is equal to or smaller than approximately 0.2 μm, the color tone is changed due to the influence of the base material 1 or the base material adhesion layer 6. When the film thickness is equal to or larger than approximately 0.3 μm, any color of the base material 1 or the base material adhesion layer 6 does not influence the change in color of the undercoat layer 2.

FIG. 5 illustrates color evaluations, compositions, and the hardnesses of the undercoat layer 2 and the gold alloy layer 4, and appearance observation results when the gold alloy layer 4 is partially lost, for the respective samples in examples 1 to 6 and in comparative examples 1 and 2. The samples in examples 1 to 6 were made according to the invention while the samples in comparative examples 1 and 2 were made by changing manufacturing conditions so as to change the color tone of the undercoat layer 2. In the acceptance determination based on the observation result when the gold alloy layer 4 has a lost portion, "accepted" indicates a case where a difference in color between the undercoat layer 2 or the adhesion layer 3 at the lost portion and the gold alloy layer 4 cannot be visually recognized and the appearance has no problem, while "failed" indicates a case where a difference in color between the undercoat layer 2 or the adhesion layer 3 at the lost portion and the gold alloy layer 4 can be visually recognized.

The color tone of the undercoat layer 2 is preferably close to the color tone of the gold alloy layer 4 in order to reduce a change in appearance even when the adhesion layer 3 on the undercoat layer 2 or the gold alloy layer 4 above the undercoat layer 2 is partially lost or peeled off due to scratches. As illustrated in FIG. 5, in the appearance observation results of the samples made in examples 1 to 6 and comparative examples 1 and 2 when the gold alloy layer 4 is partially lost, a color difference between the undercoat layer 2 and the gold alloy layer 4 is large in comparative examples 1 and 2, causing the color of the lost portion to be visually observed as a different color and resulting in the lost portion becoming noticeable. In examples 1 to 6, however, a color difference between the undercoat layer 2 and the gold alloy layer 4 is small, reducing difference in appearance and resulting in the lost portion being hardly recognized. The color tone of the undercoat layer 2 is, thus, preferably in such a range that the color evaluation according to the $L^*a^*b^*$ color specification system satisfies that $70.6 \leq L^* \leq 73.0$, $5.0 \leq a^* \leq 7.1$, and $11.7 \leq b^* \leq 15.2$.

Adhesion Layer

The adhesion layer 3 is a mixture of the undercoat layer 2 (titanium carbon nitride) and the gold alloy layer (gold, copper, and palladium). The adhesion layer 3 is provided between the undercoat layer 2 and the gold alloy layer 4, thereby making it possible to increase adhesion between the undercoat layer 2 (titanium carbon nitride) and the gold alloy layer 4 (gold, copper, and palladium), which are different materials. The adhesion layer 3, thus, can prevent peeling-off of the gold alloy layer 4, thereby making it possible to improve functional quality such as scratch resistance and abrasion resistance.

The adhesion layer 3 is preferably formed with a thickness of approximately 0.05 μm. The film thickness of approximately 0.05 μm can have an effect for improving adhesion. It is undesirable that the film thickness is excessively increased because an amount of used noble metals is increased, resulting in costs being increased.

Gold Alloy Layer

The gold alloy layer 4 is a gold alloy (gold, copper, and palladium). The color tone of the gold alloy layer 4 preferably has a pale pink gold color. As illustrated in the observation results of the gold alloy layers 4 of examples 1 to 6 and comparative examples 1 and 2, all of the samples have a beautiful appearance having a pink color like cherry blossoms. The color evaluation according to the $L^*a^*b^*$ color specification system of the gold alloy layer 4 more preferably satisfies that $84.6 \leq L^* \leq 85.4$, $5.9 \leq a^* \leq 6.1$, and $10.3 \leq b^* \leq 10.6$.

In order to obtain a pale pink gold color described above, the gold alloy layer 4 contains 70.3 to 75.8% by weight of gold, 20.0 to 25.6% by weight of copper, and 3.7 to 4.4% by weight of palladium, and preferably contains 70.3 to 75.2% by weight of gold, 20.7 to 25.6% by weight of copper, and 3.7 to 4.3% by weight of palladium as its composition. In the examples 1 to 6, in which the compositions are within the range described above, illustrated in FIG. 5, the gold alloy layer 4 has a hardness ranging between 700 and 800 inclusive by Vickers hardness in a layer structure composed of the undercoat layer 2, the adhesion layer 3, and the gold alloy layer 4. The examples 1 to 6 have a pale pink gold color appearance while they are decorative members having excellent scratch resistance and abrasion resistance.

The Vickers hardness in the layer structure composed of the undercoat layer 2, the adhesion layer 3, and the gold alloy layer 4 was measured using HM2000XYp manufactured by Fischer Instruments Co., Ltd., serving as a microindentation tester. A Vickers indenter, which is used as a gauge head, was held under a load of 5 mN for 10 seconds. After unloading, the hardness was calculated from the penetration depth of the Vickers indenter.

As the thickness of the gold alloy layer 4 is too increased, an amount of used noble metals is increased, resulting in costs being increased. The gold alloy layer 4 is, thus, preferably formed with a thickness of approximately 0.1 μm. The gold alloy layer 4 having a thickness of approximately 0.1 μm can be formed on the entire surface of the base material 1 with a uniform color tone.

As described above, the hard decorative member of the invention includes the undercoat layer 2 that is formed on the base material 1 and includes titanium carbon nitride, the adhesion layer 3 that is formed on the undercoat layer 2 and includes titanium carbon nitride, gold, copper, and palladium, and the gold alloy layer 4 that is formed on the adhesion layer 3 and includes gold, copper, and palladium. The color evaluation according to the $L^*a^*b^*$ color specification system of the undercoat layer 2 satisfies that $70.6 \leq L^* \leq 73.0$, $5.0 \leq a^* \leq 7.1$, and $11.7 \leq b^* \leq 15.2$, so that the undercoat layer 2 has a pale pink color appearance. The color evaluation according to the $L^*a^*b^*$ color specification system of the gold alloy layer 4 satisfies that $84.6 \leq L^* \leq 85.4$, $5.9 \leq a^* \leq 6.1$, and $10.3 \leq b^* \leq 10.6$, and, so that the gold alloy layer 4 has a pale pink color appearance. The hard decorative member of the invention has a pink color appearance like cherry blossoms, and can reduce a color difference between the gold alloy layer 4 and the undercoat layer 2 even when the gold alloy layer 4 is locally lost to expose the undercoat layer 2, thereby making it possible to reduce difference in appearance.

The undercoat layer 2 of the hard decorative member of the invention has a hardness ranging between 2100 and 2400 inclusive by Vickers hardness. The layer structure composed of the undercoat layer 2, the adhesion layer 3, and the gold alloy layer 4 of the hard decorative member of the invention has a hardness ranging between 700 and 800 inclusive by Vickers hardness. Accordingly, the hard decorative member of the invention has a sufficient hardness required for decorative members. The invention, thus, can provide the hard decorative member having excellent durability such as scratch resistance and abrasion resistance.

Manufacturing Method of Hard Decorative Member

Figure 3:
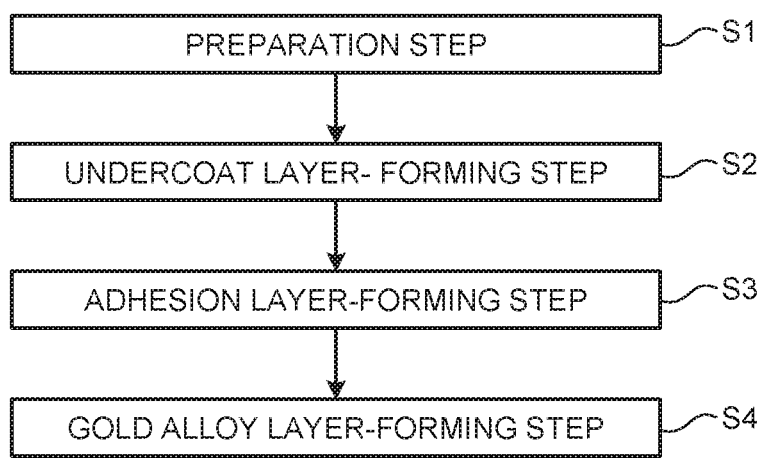
FIG. 3 is a process chart illustrating a manufacturing method according to another embodiment of the invention.

The following describes a manufacturing method of the hard decorative member according to another embodiment of the invention with reference to the step chart in FIG. 3. The manufacturing method of the hard decorative member of the invention includes a preparation step S1, an undercoat layer-forming step S2, an adhesion layer-forming step S3, and a gold alloy layer-forming step S4. At the preparation step S1, evaporation materials and the base material 1 are set in a chamber of a vacuum device. At the undercoat layer-forming step S2, titanium carbon nitride is formed as the undercoat layer 2. At the adhesion layer-forming step, the adhesion layer 3 including titanium carbon nitride, gold, copper, and palladium is formed. At the gold alloy layer-forming step S4, the gold alloy layer 4 including gold, copper, and palladium is formed.

Preparation Step S1

At the preparation step S1, titanium and a gold alloy (alloy of gold, copper, and palladium) are set, as evaporation materials, into corresponding respective crucibles in the chamber of the vacuum device, the base material 1, which is made of titanium or composed of a base and titanium formed on a surface of the base, is set to a holder, and gas in the chamber of the vacuum device is exhausted to reach a pressure of approximately $4.0 \times 10^{-3}$ Pa.

As a result of the gas being exhausted to reach a pressure ranging from $3.0 \times 10^{-3}$ Pa to $5.0 \times 10^{-3}$ Pa at the preparation step S1, gas remaining in the chamber is reduced, thereby causing influence of remaining gas on the color tone at the undercoat layer-forming step S2 and the gold alloy layer-forming step S4 to be reduced. The further increasing the degree of vacuum, the further reducing the remaining gas. Further depressurization from that described above, however, has not so much influence on the change in color tone, but causes an increase in gas exhausting time.

Undercoat Layer-Forming Step S2

At the undercoat layer-forming step S2, argon gas, nitrogen gas, and methane gas are introduced into the chamber of the vacuum device at a flow rate of approximately 190 cc/min, approximately 100 cc/min, and approximately 50 cc/min, respectively, a cathode voltage of 10 V is applied to the base material 1, thereafter, ion plating is performed for about 30 minutes by irradiating the evaporation material (titanium) set into the crucible with electron beams to evaporate titanium while the degree of vacuum is maintained at approximately 0.2 Pa, thereby forming the undercoat layer 2 of titanium carbon nitride on the base material 1.

Adhesion Layer-Forming Step S3

At the adhesion layer-forming step S3, ion plating is performed for about 1 minute by irradiating the evaporation material (gold alloy including gold, copper, and palladium) with electron beams while argon gas, nitrogen gas, and methane gas are continued to be introduced into the chamber of the vacuum device at a flow rate of approximately 190 cc/min, approximately 100 cc/min, and approximately 50 cc/min, respectively, and electron beam irradiation to the evaporation material (titanium) set into the crucible is maintained after the undercoat layer-forming step S2, thereby forming, on the undercoat layer 2, the adhesion layer 3 including titanium carbon nitride, and the gold alloy containing gold, copper, and palladium.

Gold Alloy Layer-Forming Step S4

At the gold alloy layer-forming step S4, the electron beam irradiation to titanium, which is the evaporation material set into the crucible, is stopped, and the introduction of nitrogen gas and methane gas is stopped, after the adhesion layer-forming step S3, and then ion plating is performed for 5 minutes while argon gas is introduced into the vacuum chamber at a flow rate of approximately 280 cc/min, thereby forming the gold alloy layer 4 on the adhesion layer 3.

In order to stabilize a plasma density and amounts of evaporation of evaporation materials, film formation at the undercoat layer-forming step S1, the adhesion layer-forming step S2, and the gold alloy layer-forming step S3, is preferably performed at a constant degree of vacuum in a range approximately from 0.1 to 0.5 Pa in which plasma is sufficiently maintained.

The color tone of the undercoat layer 2 can be obtained by introducing nitrogen gas and methane gas into the vacuum chamber at a flow rate of approximately 100 cc/min and approximately 50 cc/min, respectively, at the undercoat layer-forming step S2 and the adhesion layer-forming step S3. With an increase in nitrogen gas amount or with a decrease in methane gas amount on the basis of the gas amounts described above, the color tone of titanium carbon nitride approaches a yellow gold color of titanium nitride. In contrast, with a decrease in nitrogen gas amount or with an increase in methane gas amount, the color tone of titanium carbon nitride approaches a gray gold color of titanium carbide. In order to keep a degree of vacuum constant in addition to maintain plasma, argon gas is flowed into the vacuum chamber at the respective flow rates at the undercoat layer-forming step S2, the adhesion layer-forming step S3, and the gold alloy layer-forming step S4.

When the cathode voltage in film formation is lower than 10 V, processing conditions shift to those of a vacuum deposition method from those of the ion plating method. As a result, sufficient adhesion, abrasion resistance, and color tone cannot be obtained. When the cathode voltage is higher than 30 V, adhesion is further increased, but an occurrence frequency of discharge adversely affecting film formation is increased. The cathode voltage is, thus, preferably to be set in a range from 10 V to 30 V in which sufficient adhesion is achieved.

Base Material Adhesion Layer-Forming Step S1'

Figure 4:
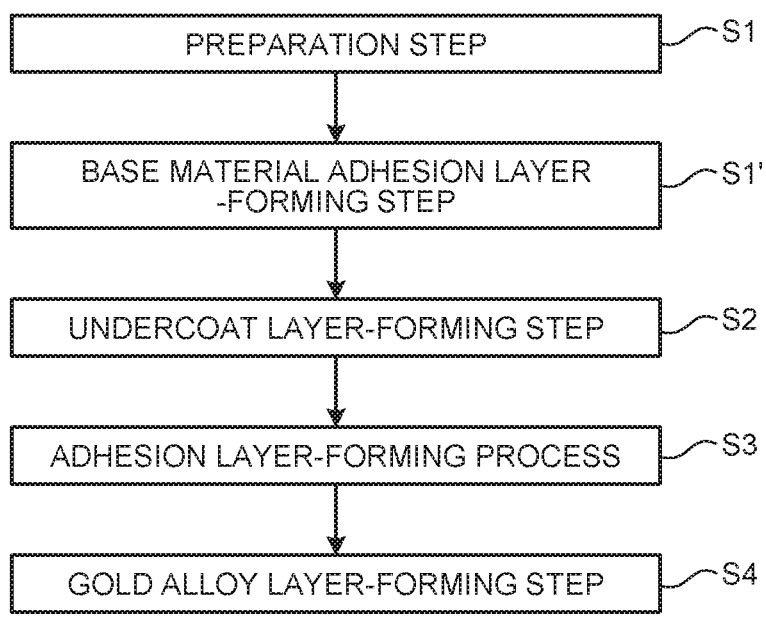
FIG. 4 is another process chart illustrating the manufacturing method according to the other embodiment of the invention.

As illustrated in the process chart in FIG. 4, when the material of the base material 1 is not titanium, a base material adhesion layer-forming step S1' is performed, thereby making it possible to use various materials for the base material 1. The base material adhesion layer-forming step S1', at which the base material adhesion layer 6 is formed on a surface of the base 5, is performed between the preparation step S1 and the undercoat layer-forming step S2.

At the base adhesion layer-forming step S1', ion plating is performed for 3 minutes by irradiating the evaporation material (titanium) set into the crucible with electron beams while argon gas is introduced into the vacuum chamber at a flow rate of approximately 280 cc/min and a cathode voltage of 10 V is applied to the base 5, after the preparation step S1, thereby forming the base material adhesion layer 6 of pure titanium.

The gas amounts and the ion plating time are not limited to those described in the embodiments. They are merely exemplified.

As described above, the hard decorative member and the manufacturing method of the hard decorative member of the invention can obtain watch external parts having a gold alloy layer having a pale pink gold color.

In addition, the composition and the color tone of the undercoat layer 2 are adjusted so as to fit the gold alloy layer 4 having a pale pink gold color. As a result, even when the gold alloy layer 4 is locally scratched, the scratch is unnoticeable with a little difference in appearance.

Furthermore, titanium carbon nitride of the undercoat layer 2 has a high hardness. Accordingly, even when the hard decorative member is partially scratched, the base material is not exposed. The invention can provide the hard decorative member that has excellent scratch resistance and abrasion resistance.

The hard decorative member of the embodiment includes a gold alloy layer formed as a film by a dry plating method on a base material made of titanium or composed of a base and titanium formed on a surface of the base. The hard decorative member includes an undercoat layer that is formed on the base material and includes titanium carbon nitride, an adhesion layer that is formed on the undercoat layer and includes titanium carbon nitride, gold, copper and palladium and a gold alloy layer that is formed on the adhesion layer and includes gold, copper and palladium. With this structure, the hard decorative member has a pale pink color appearance and excellent scratch resistance.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A hard decorative member that includes a gold alloy layer formed as a film by a dry plating method on a base material, where the base material is composed of titanium, or is composed of a base and titanium formed on a surface of the base, the hard decorative member comprising:
    an undercoat layer that is formed on the base material and includes titanium carbon nitride;
    an adhesion layer that is formed on the undercoat layer and includes titanium carbon nitride, gold, copper and palladium; and
    a gold alloy layer that is formed on the adhesion layer and includes gold, copper, and palladium,
    wherein the gold alloy layer contains 70.3 to 75.2% by weight of gold, 20.7 to 25.6% by weight of copper and 3.7 to 4.3% by weight of palladium,
    wherein a color evaluation according to an L*a*b* color specification system of the gold alloy layer satisfies that $84.6 \leq L^* \leq 85.4$, $5.9 \leq a^* \leq 6.1$ and $10.3 \leq b^* \leq 10.6$, and
    wherein the undercoat layer contains 65.3 to 69.5% by weight of titanium, 4.9 to 5.9% by weight of carbon and 25.6 to 29.9% by weight of nitrogen.

2. The hard decorative member according to claim 1, wherein
    the gold alloy layer has a Vickers hardness of from 700 to 800 when the gold alloy is measured when in a layer structure composed of the undercoat layer, the adhesion layer and the gold alloy layer.

3. The hard decorative member according to claim 1, wherein
    the undercoat layer has a Vickers hardness of from 2100 to 2400.

4. The hard decorative member according to claim 1, wherein
    a color evaluation according to an L*a*b* color specification system of the undercoat layer satisfies that $70.6 \leq L^* \leq 73.0$, $5.0 \leq a^* \leq 7.1$ and $11.7 \leq b^* \leq 15.2$.

5. A method for manufacturing a hard decorative member, comprising:
    an undercoat layer-forming step of forming an undercoat layer including titanium carbon nitride on a base material made of titanium or composed of a base and titanium formed on a surface of the base;
    an adhesion layer-forming step of forming an adhesion layer on the undercoat layer, the adhesion layer including titanium carbon nitride, gold, copper and palladium; and
    a gold alloy layer-forming step of forming a gold alloy layer on the adhesion layer, the gold alloy layer containing 70.3 to 75.2% by weight of gold, 20.7 to 25.6% by weight of copper and 3.7 to 4.3% by weight of palladium.

6. The method for manufacturing a hard decorative member according to claim 5, wherein
    at the undercoat layer-forming step, the undercoat layer containing 65.3 to 69.5% by weight of titanium, 4.9 to 5.9% by weight of carbon and 25.6 to 29.9% by weight of nitrogen is formed.

7. The method for manufacturing a hard decorative member according to claim 5, wherein
    at the undercoat layer-forming step, titanium is vaporized while argon gas, nitrogen gas and methane gas are introduced into a chamber of a vacuum device, and a cathode voltage is applied to the base material.

8. The method for manufacturing a hard decorative member according to claim 5, wherein
    at the adhesion layer-forming step, titanium and a gold alloy including gold, copper and palladium are vaporized while argon gas, nitrogen gas and methane gas are introduced into a chamber of a vacuum device, and a cathode voltage is applied to the base material.

9. The method for manufacturing a hard decorative member according to claim 5, wherein
    at the gold alloy layer-forming step, a gold alloy including gold, copper and palladium is vaporized while argon gas is introduced into a chamber of a vacuum device, and a cathode voltage is applied to the base material.

10. The hard decorative member according to claim 1, wherein the undercoat layer has a thickness of greater than 0.2 μm.

11. The hard decorative member according to claim 1, wherein the undercoat layer has a thickness of greater than 0.3 μm.

* * * * *